(12) United States Patent
Tsukada et al.

(10) Patent No.: US 10,347,417 B2
(45) Date of Patent: Jul. 9, 2019

(54) THREE-PHASE AC REACTOR CAPABLE OF REDUCING LEAKAGE OF MAGNETIC FLUX

(71) Applicant: FANUC CORPORATION, Yamanashi (JP)

(72) Inventors: Kenichi Tsukada, Yamanashi (JP); Masatomo Shirouzu, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/895,138

(22) Filed: Feb. 13, 2018

(65) Prior Publication Data

US 2018/0233275 A1    Aug. 16, 2018

(30) Foreign Application Priority Data

Feb. 16, 2017   (JP) ................. 2017-027249

(51) Int. Cl.
| | |
|---|---|
| H01F 27/04 | (2006.01) |
| H01F 27/34 | (2006.01) |
| H01F 27/02 | (2006.01) |
| H01F 27/24 | (2006.01) |
| H01F 27/28 | (2006.01) |
| H05K 1/18 | (2006.01) |
| H01F 3/14 | (2006.01) |
| H01F 27/26 | (2006.01) |
| H01F 37/00 | (2006.01) |

(52) U.S. Cl.
CPC ............. *H01F 27/346* (2013.01); *H01F 3/14* (2013.01); *H01F 27/02* (2013.01); *H01F 27/24* (2013.01); *H01F 27/263* (2013.01); *H01F 27/2823* (2013.01); *H01F 37/00* (2013.01); *H05K 1/181* (2013.01); *H05K 2201/1003* (2013.01)

(58) Field of Classification Search
CPC ......... H05K 1/181; H01F 27/02; H01F 27/04; H01F 27/22; H01F 27/23; H01F 27/24; H01F 27/28; H01F 27/29; H01F 27/30; H01F 27/33; H01F 27/245; H01F 27/346
USPC ................ 174/260; 363/17, 35, 39, 40, 126; 336/5, 12, 198, 208
See application file for complete search history.

(56) References Cited

U.S. PATENT DOCUMENTS

| | | | | |
|---|---|---|---|---|
| 2,406,704 | A | | 8/1946 | Mossay et al. |
| 4,651,266 | A | * | 3/1987 | Fujioka ............ H02M 1/14 363/126 |
| 9,608,431 | B2 | * | 3/2017 | Carter ............... H02H 3/093 |
| 2007/0134140 | A1 | * | 6/2007 | Tabata ............ C01B 13/115 422/186.07 |

(Continued)

FOREIGN PATENT DOCUMENTS

| | | |
|---|---|---|
| CN | 201765902 U | 3/2011 |
| DE | 102017115626 A1 | 1/2018 |

(Continued)

*Primary Examiner* — Xiaoliang Chen
(74) *Attorney, Agent, or Firm* — RatnerPrestia

(57) ABSTRACT

A three-phase AC reactor according to the present invention includes a peripherally enclosing external core; at least three core coils being in contact with or connected to an interior of the external core, each of the core coils including a core and a coil wound around the core, and the adjoining core coils being magnetically connected through a gap; and a barrier fitted on an end portion of the external core so as to enclose side surfaces of the coils.

13 Claims, 11 Drawing Sheets

(56) References Cited

U.S. PATENT DOCUMENTS

| | | | |
|---|---|---|---|
| 2012/0242261 A1* | 9/2012 | Curiac | H01F 30/14 318/400.3 |
| 2013/0187741 A1 | 7/2013 | Goodrich et al. | |
| 2014/0049246 A1* | 2/2014 | De Vidts | H01F 27/2852 323/355 |
| 2014/0268896 A1* | 9/2014 | Kurita | H01F 37/00 363/17 |
| 2014/0292455 A1* | 10/2014 | Kurita | H01F 3/14 336/5 |
| 2014/0313800 A1* | 10/2014 | Swamy | H02M 7/08 363/126 |
| 2015/0097506 A1* | 4/2015 | Feng | H02M 7/06 318/504 |
| 2015/0179330 A1 | 6/2015 | Nakanoue et al. | |
| 2015/0256061 A1* | 9/2015 | Koji | H01F 27/30 363/40 |
| 2016/0056667 A1* | 2/2016 | Konishi | H02J 9/062 307/66 |
| 2017/0011842 A1 | 1/2017 | Ishigaki et al. | |
| 2018/0025830 A1* | 1/2018 | Tsukada | H01F 27/22 336/198 |
| 2018/0065221 A1* | 3/2018 | Cheng | B23Q 5/16 |
| 2018/0090262 A1* | 3/2018 | Tsukada | H01F 27/29 |
| 2018/0122564 A1* | 5/2018 | Tsukada | H01F 27/02 |

FOREIGN PATENT DOCUMENTS

| | | |
|---|---|---|
| JP | 2002-208519 A | 7/2002 |
| JP | 2010252539 A | 11/2010 |
| JP | 2011254005 A | 12/2011 |
| JP | 2015159657 A | 9/2015 |
| JP | 2016157891 A | 9/2016 |
| KR | 101675401 B1 | 11/2016 |
| WO | 2010119324 A2 | 10/2010 |

* cited by examiner

PRIOR ART

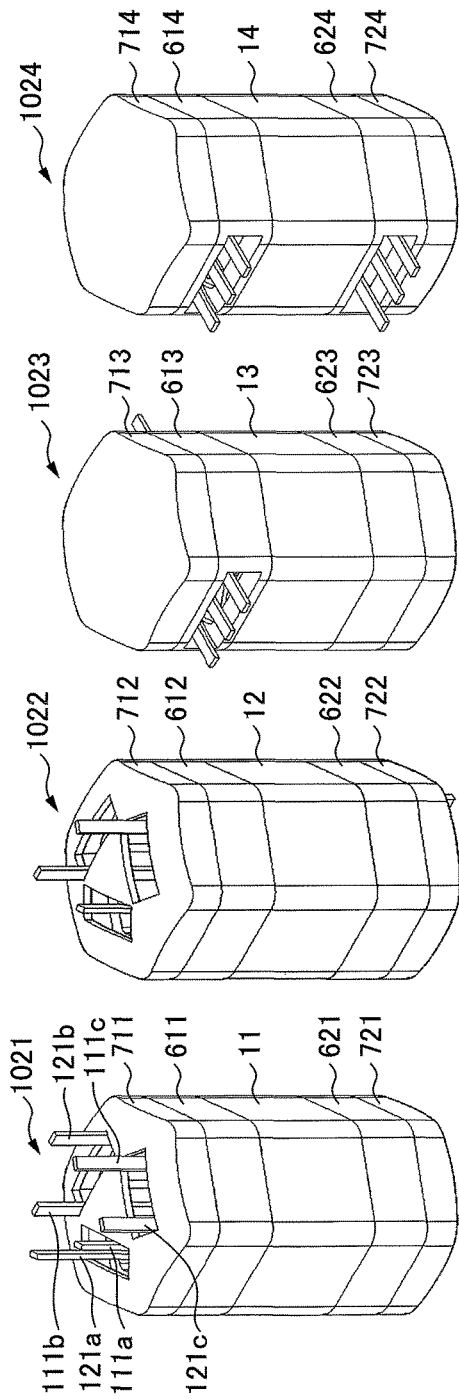

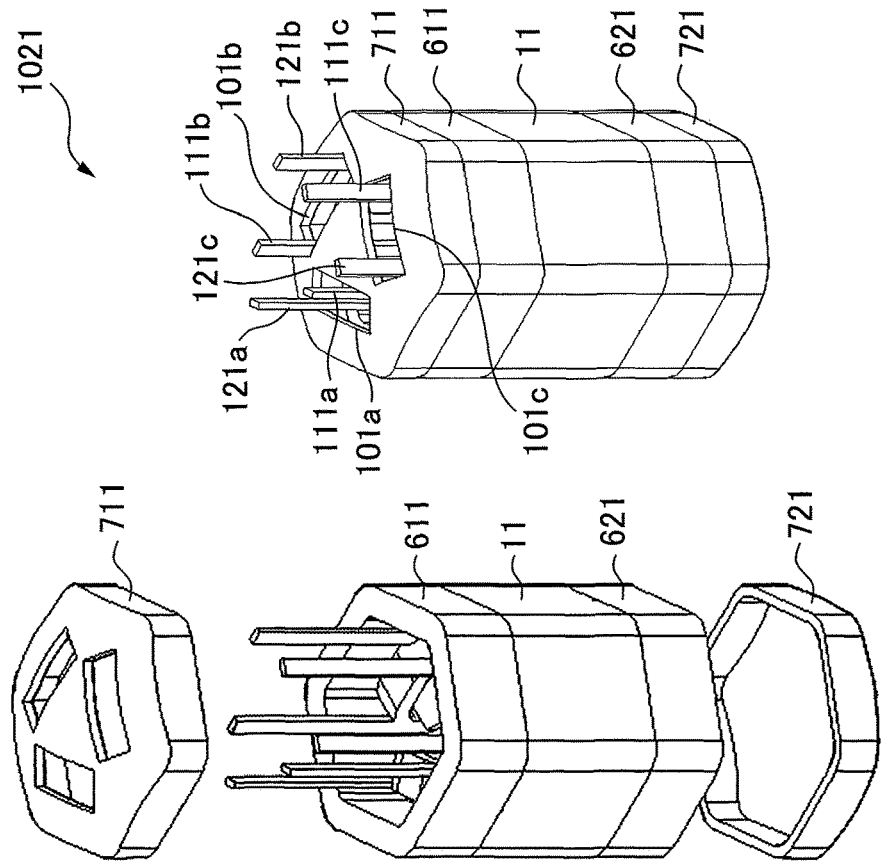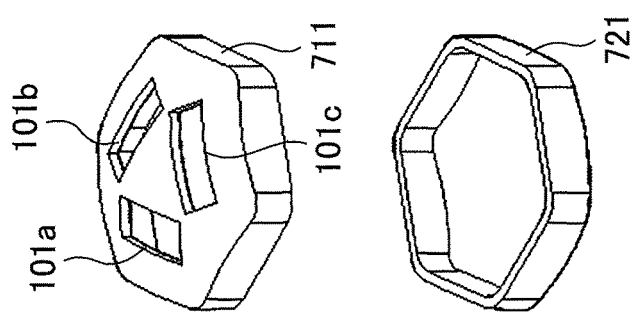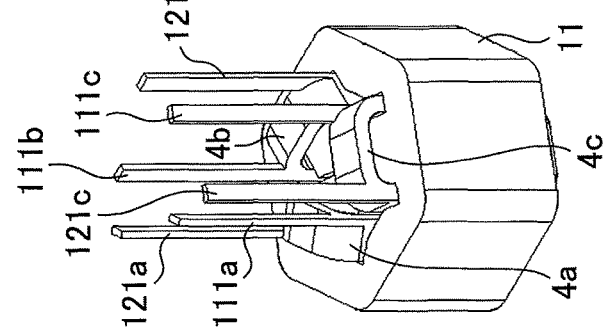

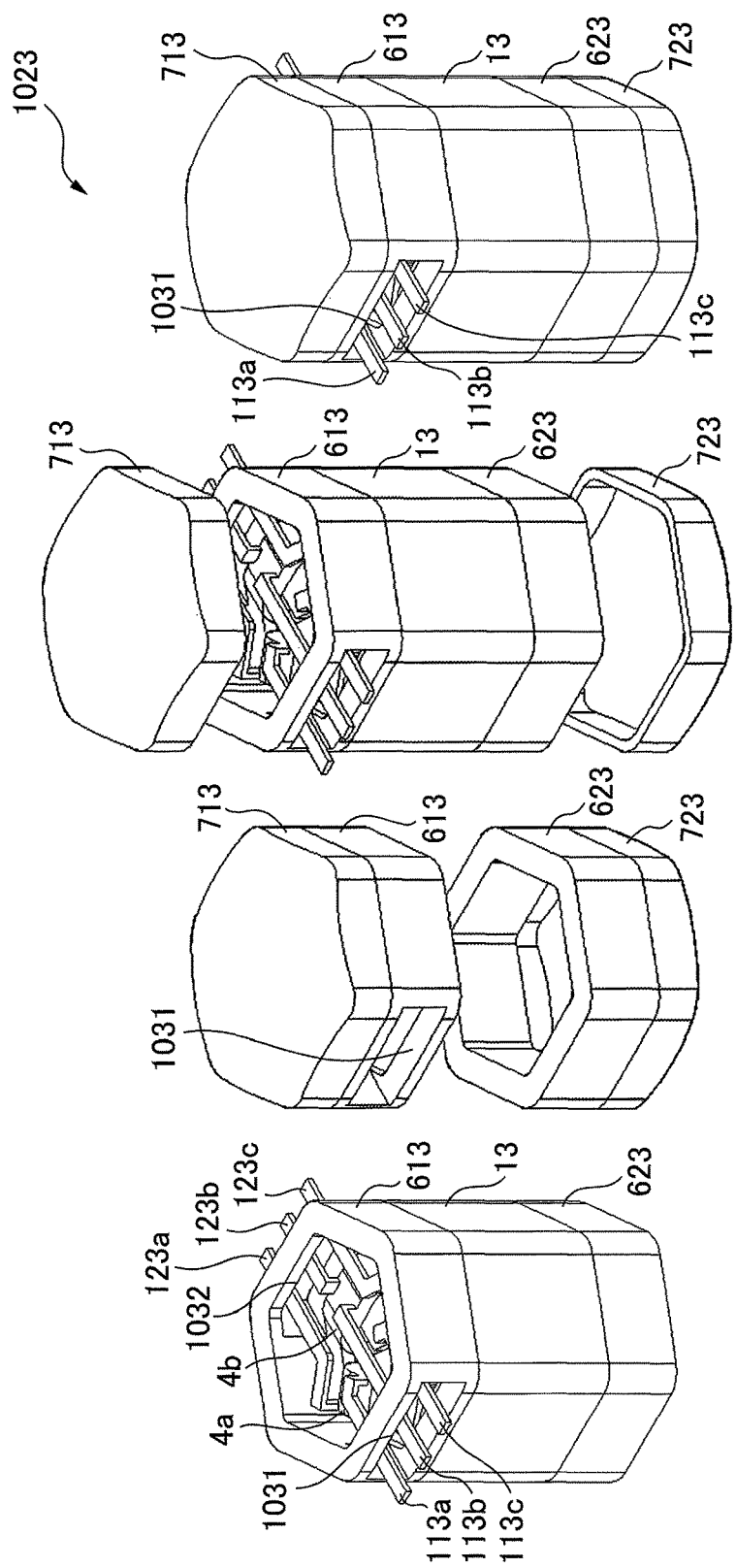

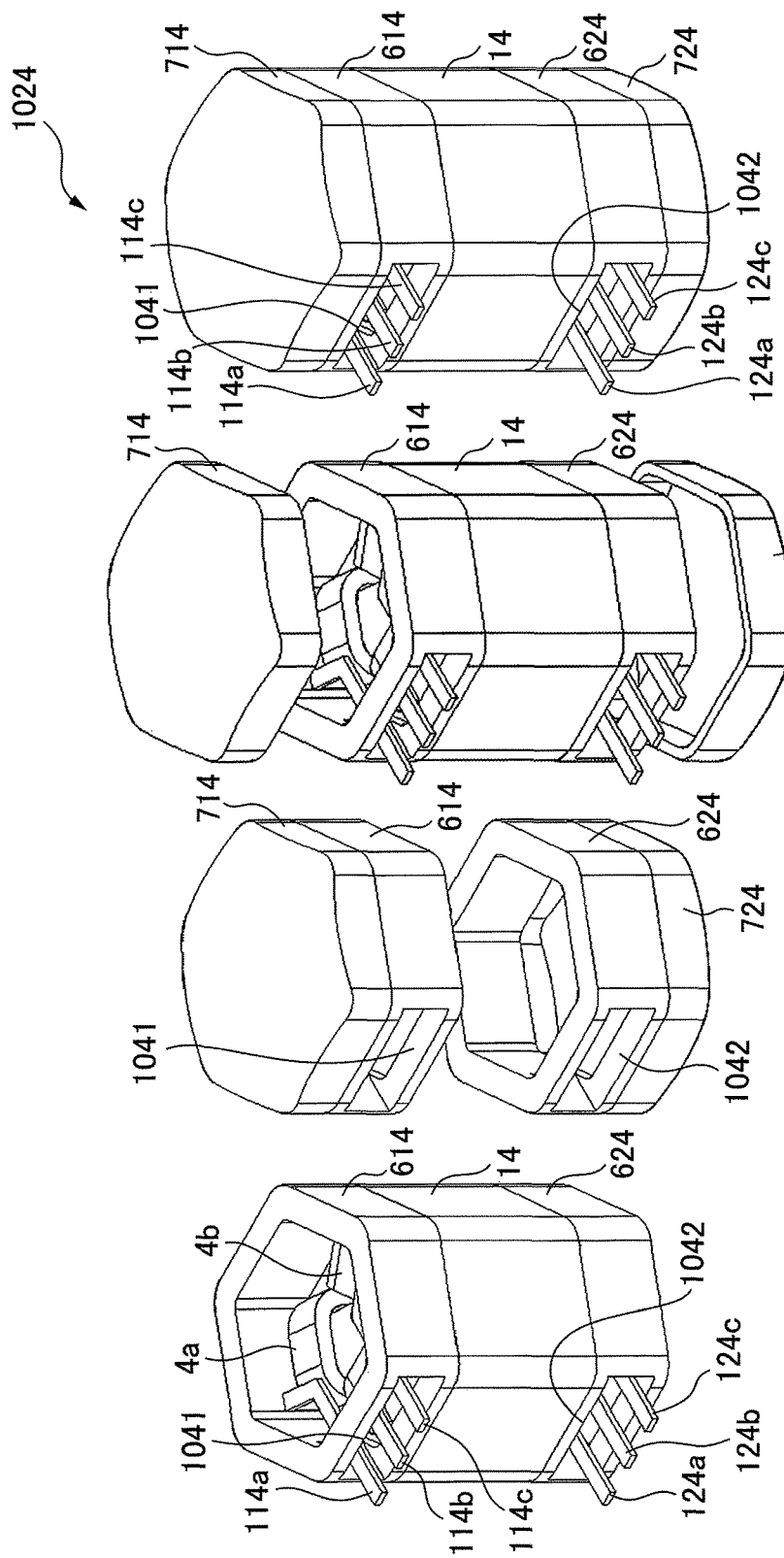

THREE-PHASE AC REACTOR CAPABLE OF REDUCING LEAKAGE OF MAGNETIC FLUX

This application is a new U.S. patent application that claims benefit of JP 2017-027249 filed on Feb. 16, 2017, the content of 2017-027249 is incorporated herein by reference.

BACKGROUND OF THE INVENTION

1. Field of the Invention

The present invention relates to a three-phase AC reactor, and more specifically relates to a three-phase AC reactor capable of reducing a leakage of magnetic flux.

2. Description of Related Art

Alternating current (AC) reactors are used in order to reduce harmonic current occurring in inverters, etc., to improve input power factors, and to reduce inrush current to the inverters. The AC reactor has a core made of a magnetic material and a coil formed around the core.

FIG. 1 shows the structure of a conventional three-phase AC reactor (for example, Japanese Unexamined Patent Publication (Kokai) No. 2002-208519). A conventional three-phase AC reactor 1000 includes cores 210 and 220, a gap 230 and coils 240. When silicon steel sheet cores are used in the reactor, the gap 230 is formed for the purpose of preventing magnetic saturation, and the coil 240 is wound on each leg of the core 220. The conventional three-phase AC reactor shown in FIG. 1 has no external core, and therefore has a problem that magnetic flux tends to leak to outside.

SUMMARY OF THE INVENTION

The present invention aims at providing a three-phase AC reactor that is capable of reducing a leakage of magnetic flux from a gap.

A three-phase AC reactor according to an aspect of this disclosure includes a peripherally enclosing external core; at least three core coils being in contact with or connected to an interior of the external core, each of the core coils including a core and a coil wound around the core, and the adjoining core coils being magnetically connected through a gap; and a barrier fitted on an end portion of the external core so as to enclose side surfaces of the coils.

BRIEF DESCRIPTION OF THE DRAWINGS

The objects, features, and advantages of the present invention will become more apparent from the following description of embodiments along with accompanying drawings. In the accompanying drawings:

FIG. 5A is a perspective view of a three-phase AC reactor having covers and barriers according to a first aspect of a second embodiment;

FIG. 5B is a perspective view of a three-phase AC reactor having covers and barriers according to a second aspect of the second embodiment;

FIG. 5C is a perspective view of a three-phase AC reactor having covers and barriers according to a third aspect of the second embodiment;

FIG. 5D is a perspective view of a three-phase AC reactor having covers and barriers according to a fourth aspect of the second embodiment;

FIG. 5E is a perspective view of the covers and the barriers according to the first aspect of the second embodiment;

FIG. 5F is a perspective view of the covers and the barriers according to the second aspect of the second embodiment;

FIG. 5G is a perspective view of the covers and the barriers according to the third aspect of the second embodiment;

FIG. 5H is a perspective view of the covers and the barriers according to the fourth aspect of the second embodiment;

FIG. 6A is a perspective view of an external core having coils according to the first aspect of the second embodiment;

FIG. 6B is a perspective view of the covers according to the first aspect of the second embodiment;

FIG. 6C is a perspective view of the three-phase AC reactor having the barriers, before fitting the covers thereon, according to the first aspect of the second embodiment;

FIG. 6D is a perspective view of the three-phase AC reactor having the covers and the barriers according to the first aspect of the second embodiment;

FIG. 8A is a perspective view of an external core having coils according to the third aspect of the second embodiment;

FIG. 8B is a perspective view of the covers and the barriers according to the third aspect of the second embodiment;

FIG. 8C is a perspective view of the three-phase AC reactor having the barriers, before fitting the covers thereon, according to the third aspect of the second embodiment;

FIG. 8D is a perspective view of the three-phase AC reactor having the covers and the barriers according to the third aspect of the second embodiment;

FIG. 9A is a perspective view of an external core having coils according to the fourth aspect of the second embodiment;

FIG. 9B is a perspective view of the covers and the barriers according to the fourth aspect of the second embodiment;

FIG. 9C is a perspective view of the three-phase AC reactor having the barriers, before fitting the covers thereon, according to the fourth aspect of the second embodiment;

FIG. 9D is a perspective view of the three-phase AC reactor having the covers and the barriers according to the fourth aspect of the second embodiment;

DETAILED DESCRIPTION OF THE INVENTION

Three-phase AC reactors according to embodiments will be described below with reference to the drawings.

Figure 1:
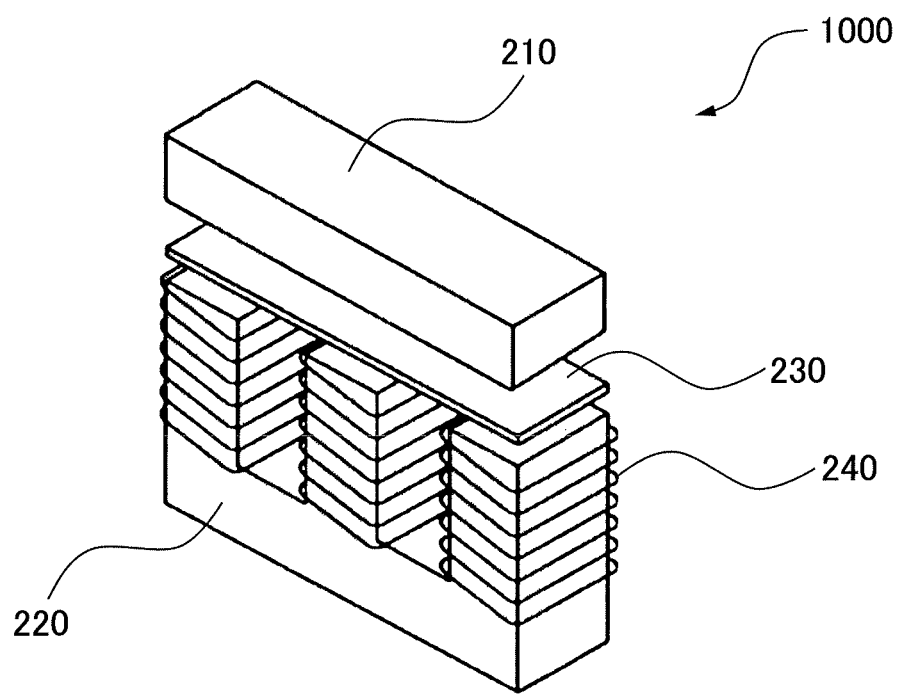
FIG. 1 is a perspective view of a conventional three-phase AC reactor.
Figure 2:
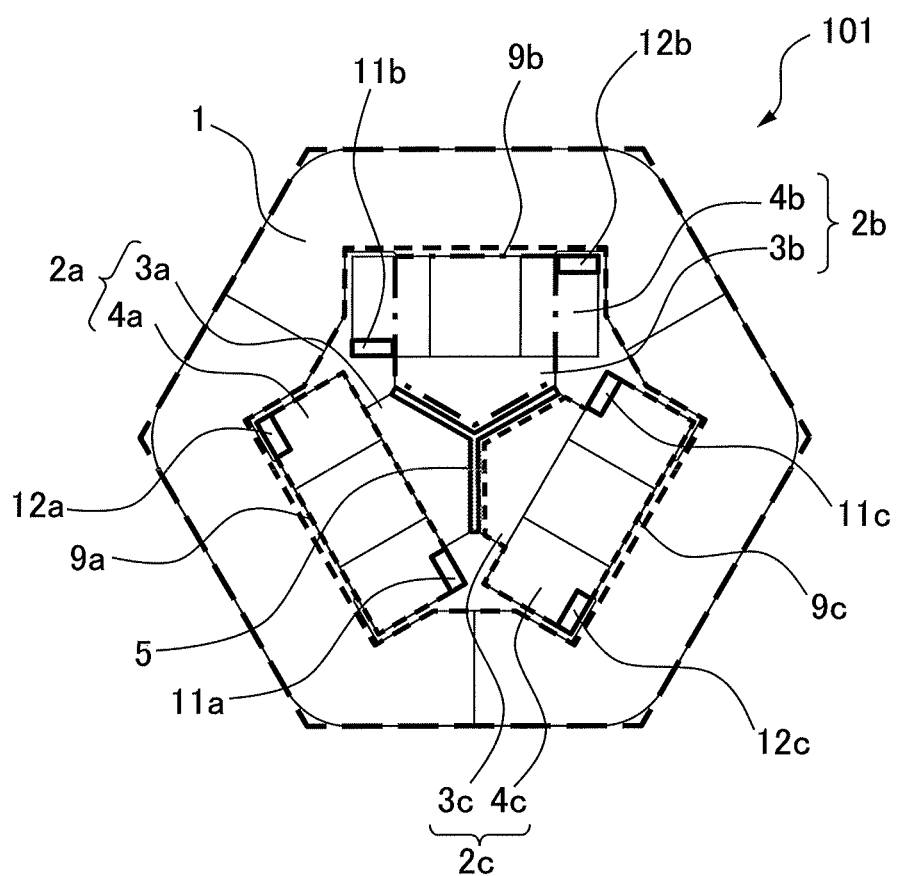
FIG. 2 is a plan view of three-phase core coils and an external core that constitute a center-gap type three-phase AC reactor according to a first embodiment.
Figure 3:
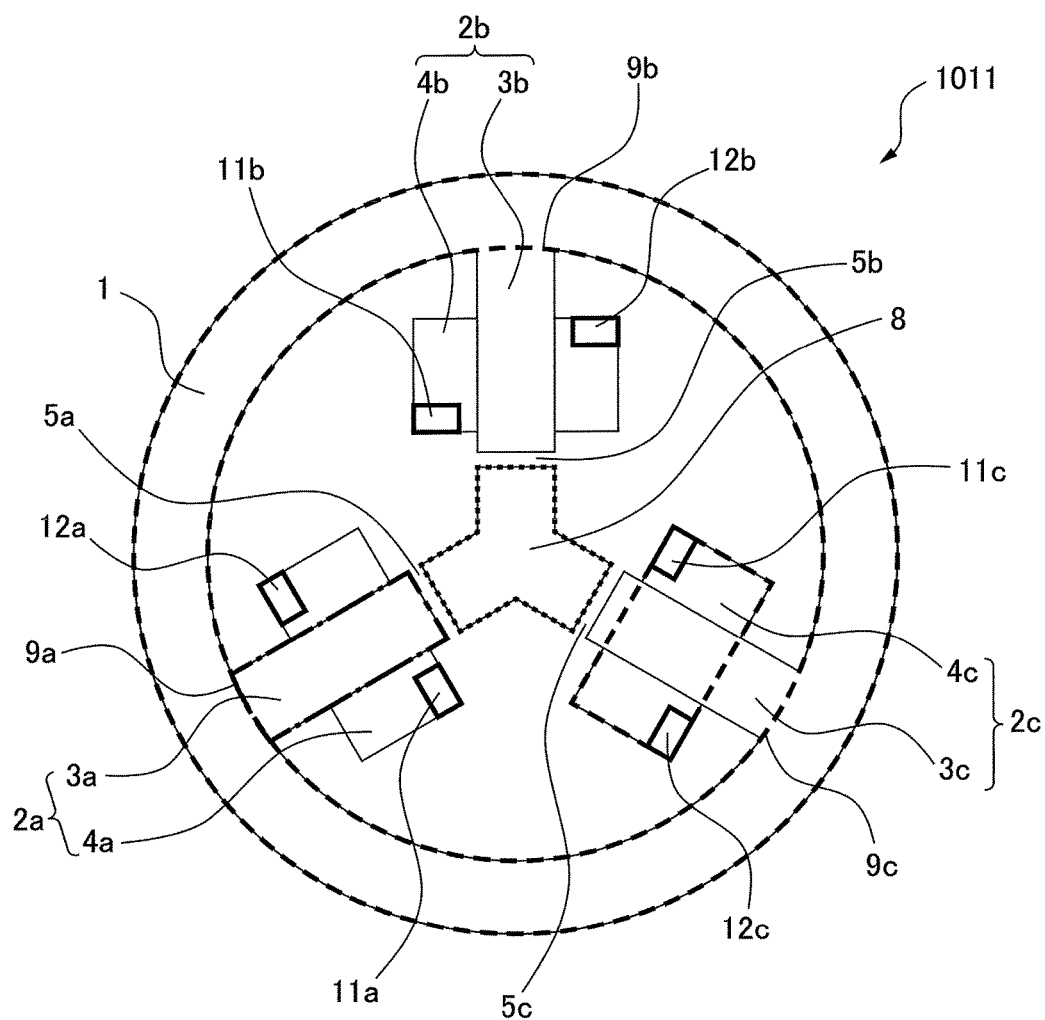
FIG. 3 is a plan view of three-phase core coils and an external core that constitute a center-core type three-phase AC reactor according to the first embodiment.

Three-phase AC reactors according to a first embodiment will be first described. FIG. 2 is a plan view of three-phase core coils and an external core that constitute a center-gap type three-phase AC reactor according to the first embodiment, and FIG. 3 is a plan view of three-phase core coils and an external core that constitute a center-core type three-phase AC reactor according to the first embodiment. For ease of explanation, the same reference numerals indicate corresponding components in FIGS. 2 and 3.

A three-phase AC reactor 101 according to the first embodiment has an external core 1 and at least three core coils (2a, 2b, and 2c). The external core 1 is structured so as to enclose the outer periphery of the three-phase AC reactor 101. The core coils (2a, 2b and 2c) are in contact with or connected to an interior of the external core 1 at connection portions (9a, 9b and 9c), respectively. Each of the core coils (2a, 2b and 2c) includes a core (3a, 3b or 3c) and a coil (4a, 4b or 4c) wound around the core. The core coils (2a, 2b, and 2c) are magnetically connected through gaps 5 formed between the core coils adjoining each other.

Each of the coils (4a, 4b and 4c) has an input lead portion (11a, 11b or 11c) and an output lead portion (12a, 12b or 12c). The coils 4a, 4b and 4c may be an R-phase coil, an S-phase coil and a T-phase coil, respectively.

The above description relates to the center-gap type three-phase AC reactor 101 shown in FIG. 2, but a center-core type three-phase AC reactor 1011 shown in FIG. 3 has a similar structure. However, the center-core type three-phase AC reactor 1011 has a center core 8 disposed at its center, and gaps (5a, 5b and 5c) each of which is formed between the center core 8 and each core coil (2a, 2b or 2c).

Figures 4A, 4B, 4C:
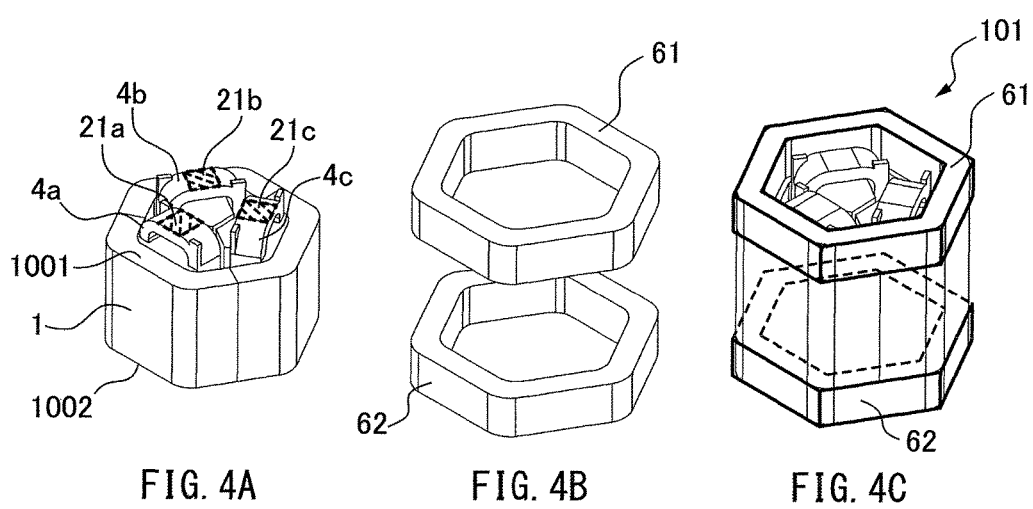
FIG. 4A is a perspective view of a three-phase AC reactor according to the first embodiment.
FIG. 4B is a perspective view of barriers according to the first embodiment.
FIG. 4C is a perspective view of the three-phase AC reactor having the barriers according to the first embodiment.

FIG. 4A is a perspective view of a three-phase AC reactor according to the first embodiment. FIG. 4B is a perspective view of barriers according to the first embodiment. FIG. 4C is a perspective view of the three-phase AC reactor having the barriers according to the first embodiment. The three-phase AC reactor according to the first embodiment has the barriers (61 and 62) that are fitted on end portions (1001 and 1002) of an external core so as to enclose side surfaces of coils (4a, 4b and 4c).

FIG. 4A shows the structure of the three-phase AC reactor, before fitting the barriers thereon. As shown in FIG. 4A, the coils (4a, 4b and 4c) protrude from the first end portion 1001 and the second end portion 1002 of the external core. More specifically, coil end surfaces (21a, 21b and 21c) are more distant from the center of the external core 1 than the first end portion 1001 and the second end portion 1002. This structure is the same as the structure of conventional three-phase AC reactors.

As shown in FIG. 4B, the two barriers (61 and 62) are fitted on the first end portion 1001 and the second end portion 1002 of the external core, respectively. To be more specific, the first barrier 61 is fitted on the first end portion 1001 of the external core. An end surface of the first barrier 61 is more distant from the center of the external core 1 than the coil end surface 21a. As a result, the first barrier 61 encloses the side surfaces of the coils (4a, 4b and 4c). In the same manner, the second barrier 62 is fitted on the second end portion 1002 of the external core. An end surface of the second barrier 62 is more distant from the center of the external core 1 than lower end surfaces (not shown) of the coils. As a result, the second barrier 62 encloses the side surfaces of the coils (4a, 4b and 4c).

The barriers (the first barrier 61 and the second barrier 62) are preferably made of a magnetic material. The barriers may be plate members.

FIG. 4C shows the external core 1 having the two barriers (61 and 62). The first barrier 61 is stacked on the external core 1 so as to be higher than the coil end surface 21a. The second barrier 62 is stacked on the external core 1 so as to be lower than the surface opposite the coil end surface 21a. This structure reduces a leakage of magnetic flux from gaps, and therefore reduces the effects of noise on peripheral devices, which may cause malfunctions.

Next, three-phase AC reactors according to a second embodiment will be described. FIGS. 5A to 5D are perspective views of the three-phase AC reactors having covers and barriers according to first to fourth aspects of the second embodiment, respectively. FIGS. 5E and 5H are perspective views of the covers and the barriers to be fitted on the three-phase AC reactors according to the first to fourth aspects of the second embodiment, respectively.

As shown in FIGS. 5A to 5D, the difference between each of three-phase AC reactors 1021 to 1024 according to the second embodiment and the three-phase AC reactor 101 according to the first embodiment is that each of the three-phase AC reactors 1021 to 1024 further includes covers (711 and 721, 712 and 722, 713 and 723, or 714 and 724) for covering coil end surfaces (21a, 21b and 21c (see FIG. 4A)). The other structure of the three-phase AC reactors 1021 to 1024 according to the second embodiment is the same as that of the three-phase AC reactor 101 according to the first embodiment, so a detailed description is omitted.

As shown in FIGS. 5A, 5B, 5E and 5F, in the three-phase AC reactors 1021 and 1022 according to the first and second aspects of the second embodiment, through holes are preferably formed in at least a part of the covers (711, 721, 712 and 722) to draw out lead portions therethrough. The structure of the three-phase AC reactors 1021 and 1022 according to the first and second aspects of the second embodiment will be described later in detail.

As shown in FIGS. 5C, 5D, 5G and 5H, in the three-phase AC reactors 1023 and 1024 according to the third and fourth aspects of the second embodiment, through holes are preferably formed in at least a part of the barriers (613, 623, 614 and 624) to draw out lead portions therethrough. The structure of the three-phase AC reactors 1023 and 1024 according to the third and fourth aspects of the second embodiment will be described later in detail.

A three-phase AC reactor according to the first aspect of the second embodiment will be first described with reference to FIGS. 6A to 6D. FIG. 6A is a perspective view of an external core 11 having coils constituting a three-phase AC reactor 1021 according to the first aspect of the second embodiment. Output lead portions (111a, 111b and 111c) and input lead portions (121a, 121b and 121c) extend upward from the three coils (4a, 4b and 4c). For example, the coils 4a, 4b and 4c may be an R-phase coil, an S-phase coil and a T-phase coil, respectively.

The difference between the three-phase AC reactor 1021 according to the first aspect of the second embodiment and the three-phase AC reactor 101 according to the first embodiment is that, as shown in FIG. 6A, the coils (4a, 4b and 4c) have the lead portions (111a, 121a, 111b, 121b, 111c and 121c) extending from coil ends.

The lead portion 111a extends from an output end of the first coil 4a, and the lead portion 121a extends from an input end of the first coil 4a. The lead portion 111b extends from an output end of the second coil 4b, and the lead portion 121b extends from an input end of the second coil 4b. The lead portion 111c extends from an output end of the third coil 4c, and the lead portion 121c extends from an input end of the third coil 4c.

The coils (4a, 4b and 4c) and the lead portions (111a, 121a, 111b, 121b, 111c and 121c) are preferably made of copper or aluminum. Using copper provides high conductivity and high resistance to oxidation. On the other hand, using aluminum provides a reduction in cost, as compared with copper.

The coils are preferably made of rectangular wire, round wire or Litz wire. Using the rectangular wire provides an improved space factor and a reduction in the size of the three-phase AC reactor. Using the round wire provides a reduction in cost, as compared with the rectangular wire.

FIG. 6B is a perspective view of covers (711 and 721) constituting the three-phase AC reactor 1021 according to the first aspect of the second embodiment. In the first cover 711, i.e., a top cover of the covers (711 and 721), through holes (101a, 101b and 101c) are formed to draw out the lead portions (111a, 111b, 111c, 121a, 121b and 121c) shown in FIG. 6A therethrough. FIG. 6B shows the three rectangular through holes (101a, 101b and 101c), which correspond to the R-phase, the S-phase and the T-phase, formed in the first cover 711, but the invention is not limited to the example. For example, two through holes corresponding to the input lead portion and the output lead portion may be formed for each of the R-phase, the S-phase and the T-phase, in other words, total six through holes may be formed. One through hole may be formed to draw out all the lead portions therethrough. The through holes may be elliptical, arc or other shapes. Furthermore, the through holes (101a, 101b and 101c) are formed in a top surface of the first cover 711 in FIG. 6B, but when lead portions extend in a horizontal direction orthogonal to a longitudinal direction of the three-phase AC reactor 1021, through holes may be formed in a side surface of the first cover 711. On the other hand, no through hole is formed in the second cover 721, i.e., a bottom cover, of the three-phase AC reactor 1021 according to the first aspect of the second embodiment. The covers (the first cover 711 and the second cover 721) are preferably made of a magnetic material.

FIG. 6C is a perspective view of the three-phase AC reactor 1021 in which a first barrier 611 is fitted on an upper end portion of the external core 11 and a second barrier 621 is fitted on a lower end portion of the external core 11, before fitting the covers (711 and 721) thereon, according to the first aspect of the second embodiment. As shown in FIG. 6C, the first cover 711 covers a hollow of the first barrier 611. In the same manner, the second cover 721 covers a hollow of the second barrier 621.

FIG. 6D is a perspective view of the three-phase AC reactor 1021 having the covers and the barriers according to the first aspect of the second embodiment. The R-phase output lead portion 111a and input lead portion 121a are drawn out through the R-phase through hole 101a. In the same manner, the S-phase output lead portion 111b and input lead portion 121b are drawn out through the S-phase through hole 101b. Furthermore, the T-phase output lead portion 111c and input lead portion 121c are drawn out through the T-phase through hole 101c.

In the three-phase AC reactor 1021 according to the first aspect of the second embodiment shown in FIG. 6D, space of the through holes (101a, 101b and 101c) may be filled, after the lead portions (111a, 111b, 111c, 121a, 121b and 121c) are drawn out through the through holes (101a, 101b and 101c). This structure further reduces a leakage of magnetic flux to outside. The through holes are preferably filled with a magnetic material. However, an insulating material preferably covers the vicinities of the lead portions.

In FIGS. 6A to 6D, the through holes are formed only in the first cover 711, but the invention is not limited to this example. For example, when lead portions extend not only upward, as shown in FIG. 6A, but only downward, through holes may be formed only in the second cover 712.

According to the three-phase AC reactor 1021 of the first aspect of the second embodiment, since the covers (711 and 721) are fitted so as to enclose the hollows of the barriers (611 and 621), the covers cover coil end surfaces, including upper and lower end surfaces of the coils, thus further reducing a leakage of magnetic flux to outside.

Furthermore, according to the three-phase AC reactor 1021 of the first aspect of the second embodiment, since the lead portions can be drawn out above the three-phase AC reactor 1021 through the through holes (101a, 101b and 101c) formed in the first cover 711, it is possible to facilitate connection to another device.

Figures 7A, 7B, 7C, 7D:
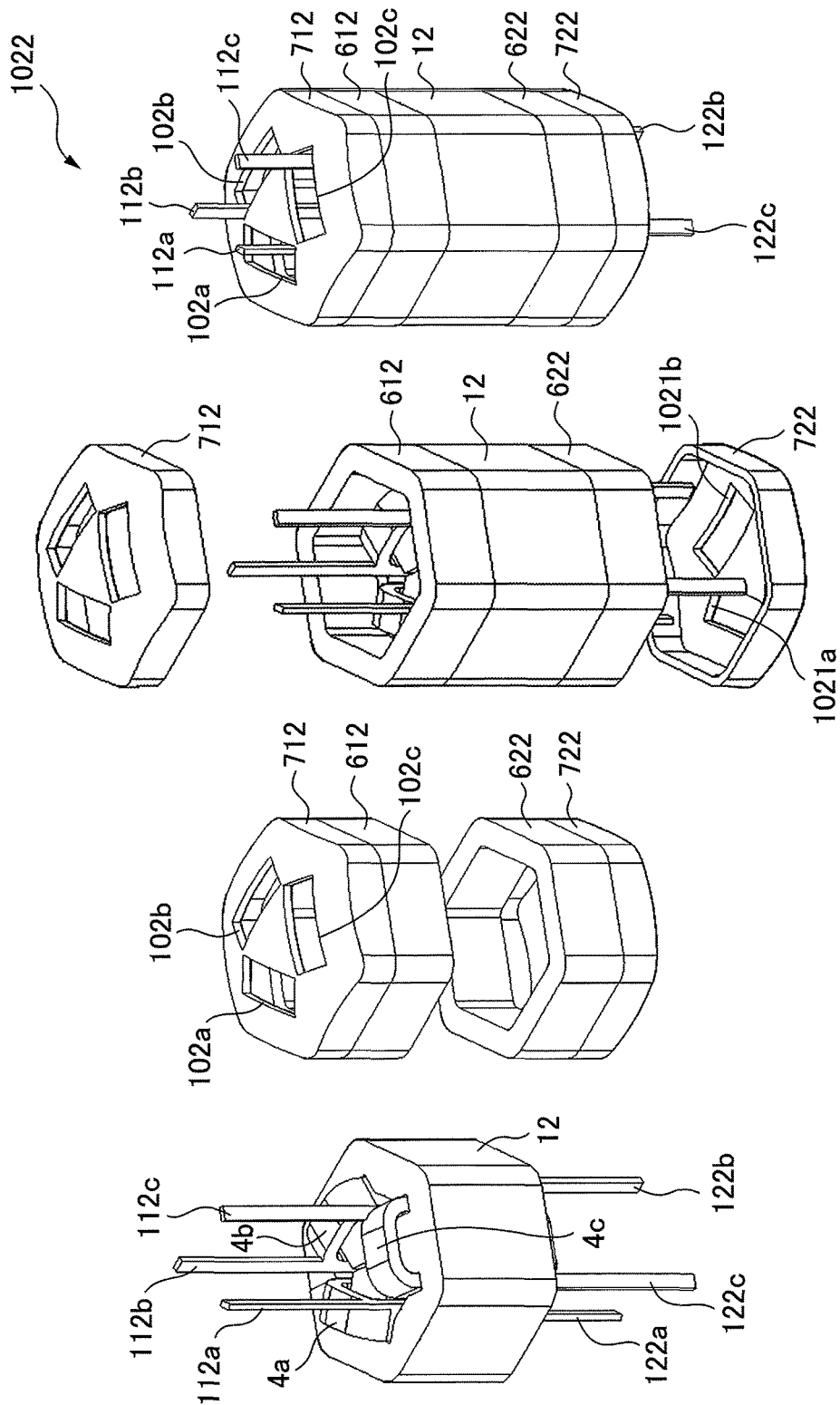
FIG. 7A is a perspective view of an external core having coils according to the second aspect of the second embodiment.
FIG. 7B is a perspective view of the covers and the barriers according to the second aspect of the second embodiment.
FIG. 7C is a perspective view of the three-phase AC reactor having the barriers, before fitting the covers thereon, according to the second aspect of the second embodiment.
FIG. 7D is a perspective view of the three-phase AC reactor having the covers and the barriers according to the second aspect of the second embodiment.

Next, a three-phase AC reactor according to the second aspect of the second embodiment will be described with reference to FIGS. 7A to 7D. FIG. 7A is a perspective view of an external core 12 having coils constituting a three-phase AC reactor 1022 according to the second aspect of the second embodiment. Output lead portions (112a, 112b and 112c) extend upward from three coils (4a, 4b and 4c), and input lead portions (122a, 122b and 122c) extend downward from the three coils (4a, 4b and 4c). For example, the coils 4a, 4b and 4c may be an R-phase coil, an S-phase coil and a T-phase coil, respectively.

FIG. 7B is a perspective view of covers (712 and 722) constituting the three-phase AC reactor 1022 according to the second aspect of the second embodiment. In the first cover 712, i.e., a top cover of the covers (712 and 722), through holes (102a, 102b and 102c) are formed to draw out the output lead portions (112a, 112b and 112c) shown in FIG. 7A therethrough. In the second cover 722, i.e., a bottom cover of the covers (712 and 722), through holes (1021a and 1021b (see FIG. 7C), and the other is not shown) are formed to draw out the input lead portions (122a, 122b and 122c) therethrough. FIG. 7B shows the three rectangular through holes (102a, 102b and 102c) formed in the first cover 712 so as to correspond to the R-phase, the S-phase and the T-phase, and the three rectangular through holes (1021a and 1021b (see FIG. 7C), and the other is not shown) formed in the second cover 722 so as to correspond to the R-phase, the S-phase and the T-phase, but the invention is not limited to the example. For example, one through hole may be formed in the first cover 712 to draw out all the output lead portions therethrough, and one through hole may be formed in the second cover 722 to draw out all the input lead portions therethrough. The through holes may be elliptical, arc or other shapes. Furthermore, the through holes (102a, 102b and 102c) are formed in a top surface of the first cover 712 in FIG. 7B, but when lead portions extend in a horizontal direction orthogonal to a longitudinal direction of the three-phase AC reactor 1022, through holes may be formed in a side surface of the first cover 712. The covers (the first cover 712 and the second cover 722) are preferably made of a magnetic material.

FIG. 7C is a perspective view of the three-phase AC reactor 1022 in which a first barrier 612 is fitted on an upper end portion of the external core 12, and a second barrier 622 is fitted on a lower end portion of the external core 12, before fitting the covers (712 and 722) thereon, according to the second aspect of the second embodiment. As shown in FIG. 7C, the first cover 712 covers a hollow of the first barrier 612. In the same manner, the second cover 722 covers a hollow of the second barrier 622.

FIG. 7D is a perspective view of the three-phase AC reactor 1022 having the covers and the barriers according to the second aspect of the second embodiment. The R-phase output lead portion 112a is drawn out through the R-phase through hole 102a formed in the first cover 712, and the R-phase input lead portion (122a (see FIG. 7A)) is drawn out through the R-phase through hole (1021a (see FIG. 7C)) formed in the second cover 722. In the same manner, the S-phase output lead portion 112b is drawn out through the S-phase through hole 102b formed in the first cover 712, and the S-phase input lead portion (122b) is drawn out through the S-phase through hole (1021b (see FIG. 7C)) formed in the second cover 722. Furthermore, the T-phase output lead portion 112c is drawn out through the T-phase through hole 102c formed in the first cover 712, and the T-phase input lead portion (122c) is drawn out through the T-phase through hole (not shown) formed in the second cover 722.

In the three-phase AC reactor 1022 according to the second aspect of the second embodiment shown in FIG. 7D, space of the through holes (102a, 102b, 102c, 1021a and 1021b) may be filled, after the lead portions (112a, 112b, 112c, 122a, 122b and 122c) are drawn out through the through holes (102a, 102b, 102c, 1021a and 1021b). This structure further reduces a leakage of magnetic flux to outside. The through holes are preferably filled with a magnetic material. However, an insulating material preferably covers the vicinities of the lead portions.

According to the three-phase AC reactor 1022 of the second aspect of the second embodiment, since the covers (712 and 722) are fitted so as to enclose the hollows of the barriers (612 and 622), the covers cover coil end surfaces, including upper and lower end surfaces of the coils, thus further reducing a leakage of magnetic flux to outside.

Furthermore, according to the three-phase AC reactor 1022 of the second aspect of the second embodiment, since the lead portions can be drawn out above and below the three-phase AC reactor 1022 through the through holes (102a, 102b and 102c) formed in the first cover 711 and the through holes (1021a and 1021b) formed in the second cover 722, it is possible to facilitate connection to another device.

Next, a three-phase AC reactor according to the third aspect of the second embodiment will be described with reference to FIGS. 8A to 8D. FIG. 8A is a perspective view of an external core 13 having coils, and barriers (613 and 623) constituting a three-phase AC reactor 1023 according to the third aspect of the second embodiment. Output lead portions (113a, 113b and 113c) extend from the three coils (4a, 4b and 4c) to one side in a horizontal direction, and input lead portions (123a, 123b and 123c) extend from the three coils (4a, 4b and 4c) to the other side in the horizontal direction. For example, the coils 4a, 4b and 4c may be an R-phase coil, an S-phase coil and a T-phase coil, respectively.

FIG. 8B is a perspective view of covers (713 and 723) and the barriers (613 and 623) constituting the three-phase AC reactor 1023 according to the third aspect of the second embodiment. An output through hole 1031 is formed in one side of the first barrier 613, i.e., an upper barrier of the barriers (613 and 623), to draw out the output lead portions (113a, 113b and 113c) shown in FIG. 8A therethrough. An input through hole 1032 is formed in the other side of the first barrier 613, to draw out the input lead portions (123a, 123b and 123c) therethrough. FIG. 8A shows the two rectangular through holes (1031 and 1032) formed in the opposite sides of the hexagonal first barrier 613, but the invention is not limited to the example. For example, the two through holes (1031 and 1032) may be formed in non-opposite sides of the hexagonal first barrier 613. Furthermore, the through holes may be elliptical, arc or other shapes. The covers (the first cover 713 and the second cover 723) are preferably made of a magnetic material.

FIG. 8C is a perspective view of the three-phase AC reactor 1023 in which the first barrier 613 is fitted on an upper end portion of the external core 13, and the second barrier 623 is fitted on a lower end portion of the external core 13, before fitting the covers (713 and 723) thereon, according to the third aspect of the second embodiment. As shown in FIG. 8C, the first cover 713 covers a hollow of the first barrier 613. In the same manner, the second cover 723 covers a hollow of the second barrier 623.

FIG. 8D is a perspective view of the three-phase AC reactor 1023 having the covers and the barriers according to the third aspect of the second embodiment. The R-phase, S-phase and T-phase output lead portions (113a, 113b and 113c) are drawn out through the output through hole 1031 formed in the first barrier 613. In the same manner, as shown in FIG. 8A, the R-phase, S-phase and T-phase input lead portions (123a, 123b and 123c) are drawn out through the input through hole 1032 (see FIG. 8A) formed in the first barrier 613.

In the three-phase AC reactor 1023 according to the third aspect of the second embodiment shown in FIG. 8D, space of the through holes (1031 and 1032) may be filled, after the lead portions (113a, 113b, 113c, 123a, 123b and 123c) are drawn out through the through holes (1031 and 1032). This structure further reduces a leakage of magnetic flux to outside. The through holes are preferably filled with a magnetic material. However, an insulating material preferably covers the vicinities of the lead portions.

According to the three-phase AC reactor 1023 of the third aspect of the second embodiment, since the covers (713 and 723) are fitted so as to enclose the hollows of the barriers (613 and 623), the covers cover coil end surfaces, including upper and lower end surfaces of the coils, thus further reducing a leakage of magnetic flux to outside.

Furthermore, according to the three-phase AC reactor 1023 of the third aspect of the second embodiment, since the output through hole 1031 and the input through hole 1032 are formed in the first barrier 613, the lead portions can be drawn out from approximately the same height of side surfaces of the three-phase AC reactor 1023, thus facilitating connection to another device.

Next, a three-phase AC reactor according to the fourth aspect of the second embodiment will be described with reference to FIGS. 9A to 9D. FIG. 9A is a perspective view of an external core 14 having coils, and barriers (614 and 624) constituting a three-phase AC reactor 1024 according to the fourth aspect of the second embodiment. Output lead portions (114a, 114b and 114c) extend from the three coils (4a, 4b and 4c) in a horizontal direction above the external core 14, and input lead portions (124a, 124b and 124c) extend from the three coils (4a, 4b and 4c) in the horizontal direction below the external core 14. For example, the coils 4a, 4b and 4c may be an R-phase coil, an S-phase coil and a T-phase coil, respectively.

FIG. 9B is a perspective view of covers (714 and 724) and the barriers (614 and 624) constituting the three-phase AC reactor 1024 according to the fourth aspect of the second embodiment. An output through hole 1041 is formed in the first barrier 614, i.e., an upper barrier of the barriers (614 and 624), to draw out the output lead portions (114a, 114b and 114c) shown in FIG. 9A therethrough. An input through hole 1042 is formed in the second barrier 624, to draw out the input lead portions (124a, 124b and 124c) therethrough. FIGS. 9A and 9B show the rectangular through holes (1041 and 1042) formed in corresponding sides of the hexagonal first barrier 614 and second barrier 624, but the invention is not limited to the example. For example, the two through holes (1041 and 1042) may be formed in different sides of the hexagonal first barrier 614 and second barrier 624. Furthermore, the through holes may be elliptical, arc or other shapes. The covers (the first cover 714 and the second cover 724) are preferably made of a magnetic material.

FIG. 9C is a perspective view of the three-phase AC reactor 1024 in which the first barrier 614 is fitted on an upper end portion of the external core 14, and the second barrier 624 is fitted on a lower end portion of the external core 14, before fitting the covers (714 and 724) thereon, according to the fourth aspect of the second embodiment. As shown in FIG. 9C, the first cover 714 covers a hollow of the first barrier 614. In the same manner, the second cover 724 covers a hollow of the second barrier 624.

FIG. 9D is a perspective view of the three-phase AC reactor 1024 having the covers and the barriers according to the fourth aspect of the second embodiment. The R-phase, S-phase and T-phase output lead portions (114a, 114b and 114c) are drawn out through the output through hole 1041 formed in the first barrier 614. In the same manner, the R-phase, S-phase and T-phase input lead portions (124a, 124b and 124c) are drawn out through the input through hole 1042 formed in the second barrier 624.

In the three-phase AC reactor 1024 according to the fourth aspect of the second embodiment shown in FIG. 9D, space of the through holes (1041 and 1042) may be filled, after the lead portions (114a, 114b, 114c, 124a, 124b and 124c) are drawn out through the through holes (1041 and 1042). This structure further reduces a leakage of magnetic flux to outside. The through holes are preferably filled with a magnetic material. However, an insulating material preferably covers the vicinities of the lead portions.

According to the three-phase AC reactor 1024 of the fourth aspect of the second embodiment, since the covers (714 and 724) are fitted so as to enclose the hollows of the barriers (614 and 624), the covers cover coil end surfaces, including upper and lower end surfaces of the coils, thus further reducing a leakage of magnetic flux to outside.

Furthermore, according to the three-phase AC reactor 1024 of the fourth aspect of the second embodiment, the lead portions can be drawn out from the side surface of the three-phase AC reactor 1024 through the output through hole 1041 formed in the first barrier 614 and the input through hole 1042 formed in the second barrier 624. Since the side surface of the first barrier 614 having the output through hole 1041 and the side surface of the second barrier 624 having the input through hole 1042 are disposed in the same orientation, the input and output lead portions can be drawn out from one surface of the three-phase AC reactor 1024, thus facilitating connection to another device.

Figure 10A:
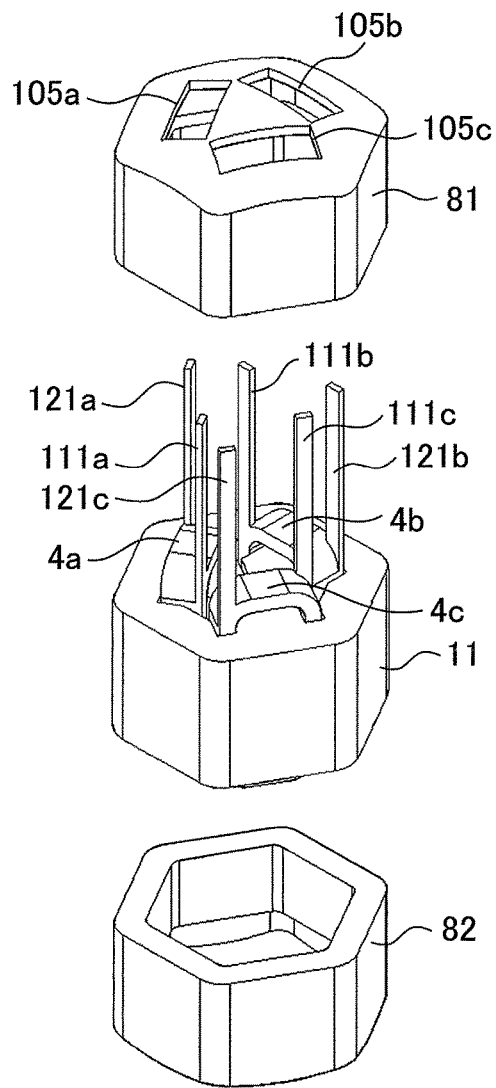
FIG. 10A is a perspective view of a three-phase AC reactor, before fitting covers formed integrally with barriers thereon, according to a third embodiment.
Figure 10B:
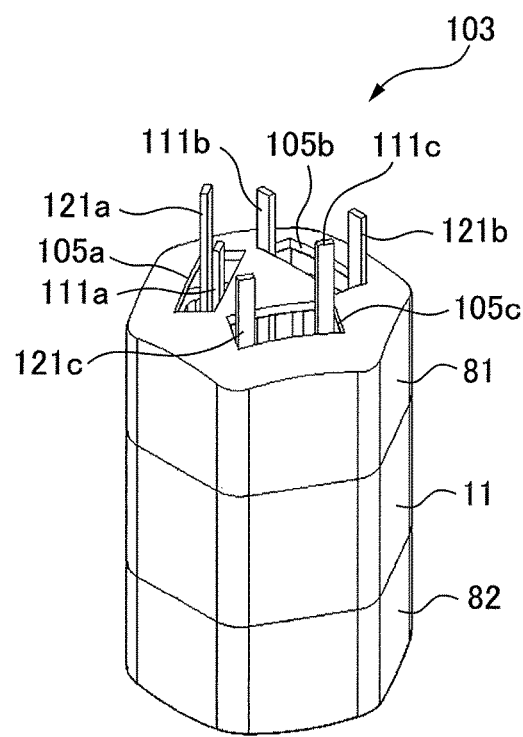
FIG. 10B is a perspective view of the three-phase AC reactor, after fitting the covers formed integrally with the barriers thereon, according to the third embodiment.

Next, a three-phase AC reactor according to a third embodiment will be described. FIG. 10A is a perspective view of the three-phase AC reactor, before fitting covers formed integrally with barriers on an external core, and FIG. 10B is a perspective view of the three-phase AC reactor, after fitting the covers on the external core, according to the third embodiment. The difference between a three-phase AC reactor 103 according to the third embodiment and the three-phase AC reactor 1021 according to the second embodiment is that covers (81 and 82) are formed integrally with barriers. The other structure of the three-phase AC reactor 103 according to the third embodiment is the same as that of the three-phase AC reactor 1021 according to the second embodiment, so a detailed description is omitted.

As shown in FIG. 10A, covers (81 and 82) formed integrally with barriers are fitted on upper and lower end portions of an external core 11. More specifically, the first cover 81 is fitted on the upper end portion of the external core 11, and the second cover 82 is fitted on the lower end portion of the external core 11. The covers (the first cover 81 and the second cover 82) are preferably made of a magnetic material.

In at least one of the covers (81 and 82), through holes are formed to draw out lead portions therethrough. For example, as shown in FIG. 10A, through holes (105a, 105b and 105c) are formed in the first cover 81, i.e., a top cover, to draw out lead portions (111a, 111b, 111c, 121a, 121b and 121c) therethrough. FIG. 10A shows the three rectangular through holes (105a, 105b and 105c), which correspond to the R-phase, the S-phase and the T-phase, formed in the first cover 81, but the invention is not limited to the example. For example, two through holes corresponding to the input lead portion and the output lead portion may be formed for each of the R-phase, the S-phase and the T-phase, in other words, total six through holes may be formed. One through hole may be formed to draw out all the lead portions therethrough. Furthermore, the through holes may be elliptical, arc or other shapes.

In the three-phase AC reactor 103 shown in FIG. 10A, no through hole is formed in the second cover 82, i.e., a bottom cover. However, not limited to the example, through holes may be formed in the second cover 82.

In the three-phase AC reactor 103 shown in FIGS. 10A and 10B, the through holes are formed in a top surface of the cover 81. However, not limited to the example, when lead portions extend in a horizontal direction, through holes may be formed in a side surface of the cover 81.

According to the three-phase AC reactor of the third embodiment, since the covers are formed integrally with the barriers, it is possible to reduce the number of man-hours required for manufacture and assembly.

Figure 11:
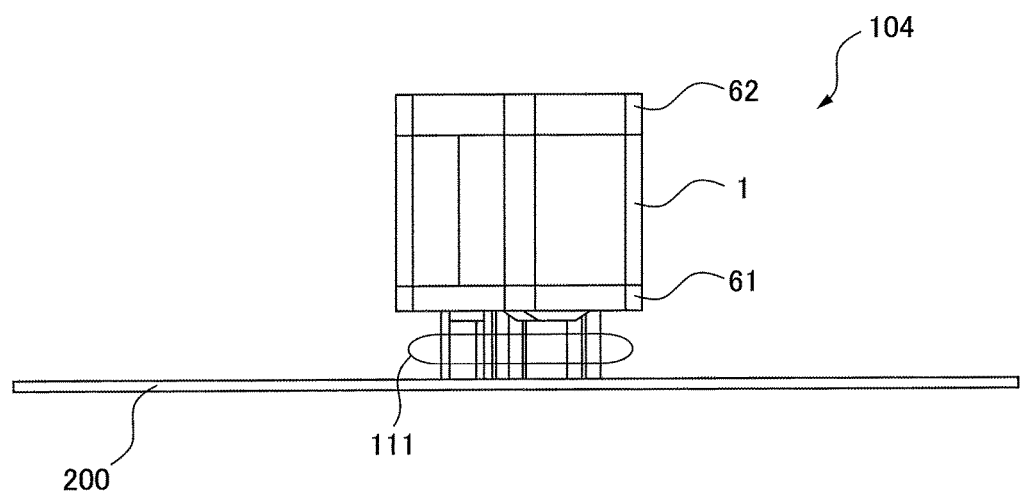
FIG. 11 is a side view of a printed board on which a three-phase AC reactor according to a fourth embodiment is mounted.

Next, a printed board having a three-phase AC reactor according to a fourth embodiment mounted thereon will be described. FIG. 11 is a side view of the printed board having the three-phase AC reactor according to the fourth embodiment mounted thereon. As shown in FIG. 11, a three-phase AC reactor 104 has barriers 61 and 62 fitted on an external core 1, and is connected to a printed board 200 with lead portions 111.

According to the three-phase AC reactor of the fourth embodiment, since coils have the lead portions extending from coil ends, it is possible to manufacture the printed board on which the three-phase AC reactor is mounted.

According to the three-phase AC reactor of the fourth embodiment, since coils have the lead portions extending from coil ends, it is possible to mount the three-phase AC reactor on the printed board as an electronic component.

According to the three-phase AC reactors of the embodiments of this disclosure, providing the external core serves to reduce a leakage of magnetic flux from the gaps.

What is claimed is:

1. A three-phase AC reactor comprising:
a peripherally enclosing external core;
at least three core coils being in contact with or connected to an interior of the external core, a side surface and another side surface of each of the core coils extending beyond the external core,
each of the core coils including a core and a coil wound around the core, and the adjoining core coils being magnetically connected through a gap; and
a first magnetic barrier fitted on one end portion of the external core so as to enclose the side surface of the coils;
a second magnetic barrier fitted on other end portion of the external core so as to enclose the another side surface of the coils;
a first cover for covering one of end surfaces of the coils; and
a second cover for covering other end surfaces of the coils;
wherein each of the coils has an output lead portion and an input lead portion, and
wherein the output lead portions pass through through holes of the first cover and the input lead portions pass through through holes of the second cover.

2. The three-phase AC reactor according to claim 1, further comprising a cover for covering an end surface of the coil.

3. The three-phase AC reactor according to claim 2, wherein the barrier and the cover are made of a magnetic material.

4. The three-phase AC reactor according to claim 1, wherein the barrier is a plate member.

5. The three-phase AC reactor according to claim 1, wherein the coil has a lead portion extending from a coil end.

6. The three-phase AC reactor according to claim 2, wherein a through hole is formed in at least a part of the cover to draw out a lead portion.

7. The three-phase AC reactor according to claim 5, wherein a through hole is formed in at least a part of the barrier to draw out the lead portion.

8. The three-phase AC reactor according to claim 2, wherein the cover is formed integrally with the barrier.

9. The three-phase AC reactor according to claim 5, wherein the coil and the lead are made of copper or aluminum.

10. The three-phase AC reactor according to claim 1, wherein the coil is made of rectangular wire, round wire or Litz wire.

11. A printed board on which the three-phase AC reactor according to claim 5 is mounted.

12. A three-phase AC reactor comprising:
a peripherally enclosing external core;
at least three core coils being in contact with or connected to an interior of the external core, a side surface and another side surface of each of the core coils extending beyond the external core;
each of the core coils including a core and a coil wound around the core, and the adjoining core coils being magnetically connected through a gap;
a first magnetic barrier fitted on one end portion of the external core so as to enclose the side surface of the coils;
a second magnetic barrier fitted on other end portion of the external core so as to enclose the another side surface of the coils;
a first cover for covering one of end surfaces of the coils; and
a second cover for covering other end surfaces of the coils;
wherein each of the coils has an output lead portion and an input lead portion, and
wherein the output lead portions and the input lead portions pass through through holes of the first cover.

13. A three-phase AC reactor comprising:
a peripherally enclosing external core;
at least three core coils being in contact with or connected to an interior of the external core, a side surface and another side surface of each of the core coils extending beyond the external core;
each of the core coils including a core and a coil wound around the core, and the adjoining core coils being magnetically connected through a gap;
a first magnetic barrier fitted on one end portion of the external core so as to enclose the side surface of the coils;
a second magnetic barrier fitted on other end portion of the external core so as to enclose the another side surface of the coils;
a first cover for covering one of end surfaces of the coils; and
a second cover for covering other end surfaces of the coils;
wherein each of the coils has an output lead portion and an input lead portion, and
wherein the output lead portions pass through through holes of the first barrier and the input lead portions pass through through holes of the second barrier.

* * * * *